United States Patent [19]

Mase et al.

[11] Patent Number: 4,828,967
[45] Date of Patent: * May 9, 1989

[54] ELECTRONIC DEVICE AND ITS MANUFACTURING METHOD

[75] Inventors: Akira Mase; Toshimitsu Konuma; Mitsunori Sakama; Takashi Inushima; Shunpei Yamazaki, all of Tokyo, Japan

[73] Assignee: Semiconductor Energy Laboratory Co., Ltd., Kanagawa, Japan

[*] Notice: The portion of the term of this patent subsequent to Oct. 25, 2005 has been disclaimed.

[21] Appl. No.: 875,211

[22] Filed: Jun. 17, 1986

Related U.S. Application Data

[62] Division of Ser. No. 813,515, Dec. 26, 1985, abandoned.

[30] Foreign Application Priority Data

Dec. 26, 1984 [JP] Japan .................. 59-277412

[51] Int. Cl.$^4$ .............................................. G03C 5/00
[52] U.S. Cl. ....................................... 430/315; 430/20; 430/311; 430/321; 430/325; 430/327; 430/330; 350/334
[58] Field of Search ............... 430/311, 314, 315, 317, 430/325, 327, 328, 330, 20, 321; 350/334, 344

[56] References Cited

U.S. PATENT DOCUMENTS

| | | | |
|---|---|---|---|
| 3,740,280 | 6/1973 | Ronen | 430/314 |
| 4,174,217 | 11/1979 | Flatley . | |
| 4,347,306 | 8/1982 | Takeda et al. | 427/96 |
| 4,369,247 | 1/1983 | Goff et al. | 430/311 |
| 4,566,186 | 1/1986 | Bauer et al. | 29/852 |
| 4,621,045 | 11/1986 | Goodner | 430/311 |
| 4,656,314 | 4/1987 | Durand | 174/68.5 |
| 4,683,183 | 7/1987 | Ono | 430/20 |
| 4,725,517 | 2/1988 | Nakanowatari | 430/20 |
| 4,730,903 | 3/1988 | Yamazaki et al. | 350/334 |
| 4,732,873 | 3/1988 | Perbet et al. | 437/101 |

FOREIGN PATENT DOCUMENTS

| | | | |
|---|---|---|---|
| 0090661 | 10/1983 | European Pat. Off. | 350/334 |
| 57-34522 | 2/1982 | Japan | 430/20 |
| 59-9635 | 11/1984 | Japan | 350/334 |
| 60-257171 | 12/1985 | Japan | 430/311 |
| 1336254 | 11/1973 | United Kingdom | 350/344 |

Primary Examiner—Jose G. Dees
Attorney, Agent, or Firm—Gerald J. Ferguson, Jr.

[57] ABSTRACT

A method of forming an insulated, non-linear, multi-layered, electronic element on a transparent substrate by surrounding the element with a photocurable resin and exposing the photocurable resin to light from the side of the transparent substrate, the photocurable resin being heat-hardened before and after the light exposure thereof so that the resulting insulating layer prevents electrical short circuits between the layers of the non-linear, multi-layered, electronic element.

9 Claims, 4 Drawing Sheets

ELECTRONIC DEVICE AND ITS MANUFACTURING METHOD

This is a divisional application of Ser. No. 813,515, filed Dec. 26, 1985, abandoned.

BACKGROUND OF THE INVENTION

1. Field of the Invention

The present invention relates to an electronic device which has a substrate with an insulating surface and a layer member including a conductive or semiconductive layer formed in a pattern on the substrate. The invention also pertains to a method for the manufacture of such an electronic device.

2. Description of the Prior Art

Heretofore a variety of electronic devices have been proposed which have a substrate with an insulating surface and a layer member including a conductive or semiconductive layer formed in a pattern on the substrate.

The layer member is formed of, for example, a conductive layer member having a conductive layer as in the case of an inter-connection layer. Another example of the layer member is formed by a conductive or semiconductive layer member which includes a conductive or semiconductive layer formed of a conductive or semiconductive material of a desired resistivity as is the case with a resistor layer. Another example of the layer member is constituted by a laminate member having a structure in which a first conductive layer serving as a first electrode, a non-single-crystal semiconductor layer member having a PN or PIN junction and a second conductive layer serving as a second electrode are laminated in that order as in the case of a nonlinear element the voltage-current characteristic of which shows a diode characteristic in a positive or negative voltage region. Yet another example of the layer member is made up of a laminate member having a structure in which a first conductive layer serving as a first electrode, a non-single-crystal semiconductor layer member having a NIN, NP−N, PIP, PN−P, NIPIN, NP−PP−N, PINIP or PN−NN−P junction and a second conductive layer serving as a second electrode are laminated in that order as in the case of a nonlinear element the voltage-current characteristic of which exhibits a diode characteristic in positive and negative regions.

Another example of the layer member is formed of a laminate member having a structure in which a first conductive layer serving as a first electrode, an I−, P− or N− type non-single-crystal semiconductor layer and a second conductive layer serving as a second electrode are laminated in that order as in the case of a nonlinear element which shows a nonlinear voltage-current characteristic. Yet another example of the layer member is formed of a laminate member having a structure in which a first conductive layer serving as a first electrode, an insulating layer serving as a barrier layer thin enough to permit the passage therethrough of a tunnel current and a second conductive layer serving as a second electrode are laminated in that order as in the case of a nonlinear element which shows a nonlinear voltage-current characteristic.

In the above electronic devices, if outer side faces of the laminate member which extend thickwise thereof are exposed to the open air, there is a fear that the outer side faces will be changed in quality by the components of air, resulting in degradation of the characteristic of the laminate m em ber. Furthermore, dust sill adhere to the exposed outer side faces, introducing the possibility of an electrical leakage occurring thereon. Accordingly, the characteristics of the electronic devices are likely to be deteriorated by the open air.

SUMMARY OF THE INVENTION

It is therefore an object of the present invention to provide a novel electronic device which has substrate and a layer member including a conductive or semiconductive layer formed in a pattern on the substrate and which is free from the abovesaid defects of the prior art.

Another object of the present invention is to provide a method for the manufacture of such an electronic device.

According to the electronic device of the present invention, the layer member is covered with an insulating layer which is in contact with its outer side faces but does not extend onto its top surface.

With such a structure, since the outer side faces are not exposed to the open air, they will not change in quality and no dust will adhere to them. Therefore, there are no possibilities of the characteristics of the layer member being degraded and an electrical leakage occurring on the outer side faces. Accordingly, the characteristics of the electronic device will not be deteriorated by the open air.

Furthermore, when the insulating layer has substantially the same thickness as the layer member, a conductive layer serving as an interconnection layer or an electrode, which extends over the layer member in contact therewith, can easily be formed on the insulating layer without introducing the likelihood that the conductive layer becomes discontinuous between the insulating layer and the layer member.

According to the manufacturing method of the present invention, the electronic device of the present invention is fabricated by a manufacturing process including the following steps.

At first, a layer member having a patterned conductive or semiconductor layer is formed on a substrate having an insulating surface. In this case, a light transparent substrate is used as the substrate. Furthermore, the layer member is formed as a layer member which has a far lower light transparency than does the substrate.

Next, a photosensitive organic resin layer is formed on the transparent substrate so that it extends thereon covering the layer member.

Next, from the photosensitive organic resin layer, an insulating layer which surrounding the layer member on the substrate is formed. In this case, the photosensitive organic resin is exposed to light from the side of the transparent substrate. Then the photosensitive organic resin layer thus exposed is subjected to development. In practice, the photosensitive organic resin layer is heat-hardened prior to the exposure. After the development an organic resin layer resulting from the development of the photosensitive organic resin is heat-hardened. In the case of involving such heat treatments, the insulating layer ultimately obtained is thinner than the original photosensitive organic resin layer. By suitably selecting the thickness of the original photosensitive organic resin layer taking the above into account, the insulating layer can be formed to the substantially the same thickness as the layer member.

Such a manufacturing method of the present invention does not involve the use of a particular mask for the formation of the insulating layer which surrounds the layer member. This allow ease in the fabrication of the electronic device.

Other objects, features and advantages of the present invention will become more fully apparent from the detailed description taken in conjunction with the accompanying drawings.

DESCRIPTION OF THE PREFERRED EMBODIMENT

FIGS. 1 to 5 illustrate an embodiment of the electronic device of the present invention, which has a substrate 1 with an insulating surface 2. The substrate 1 is transparent and made of, for example, glass.

The substrate 1 has a layer member 3 formed thereon. The layer member 3 is far lower in light transparency than the substrate 1.

Figure 1:
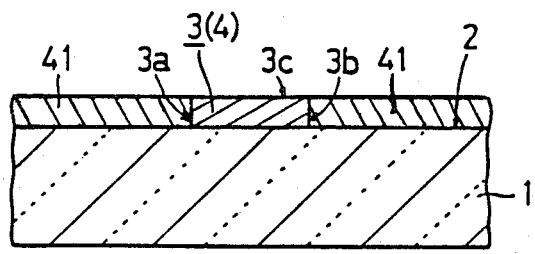
FIGS. 1 to 5 are cross-sectional views schematically illustrating embodiments of the electronic devices of the present invention.

The layer member 3 is, for example, a patterned nontransparent conductive layer 4 formed of metal or non-single-crystal semiconductor, as depicted in FIG. 1. The conductive layer 4 serves as an interconnection layer.

Figure 2:
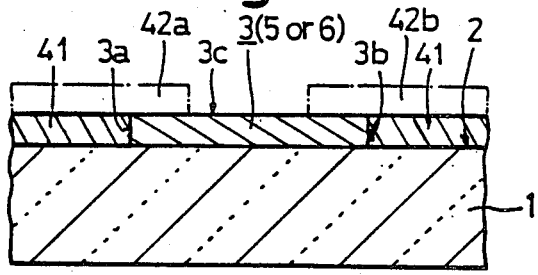

Another example of the layer member 3 is a patterned conductive layer 5 or semiconductor layer 6 formed of non-single-crystal semiconductor as a resistor layer, as shown in FIG. 2. The conductive layer 5 or the semiconductor layer 6 has a light transparency far lower than that of the substrate 1.

Figure 3:
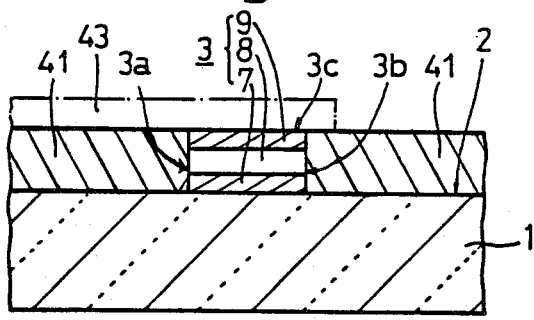

Yet another example of the layer member 3 has a structure in which a patterned conductive layer 7 serving as an electrode, a patterned non-single-crystal semiconductor layer member 8 and a patterned conductive layer 9 serving as another electrode are laminated in that order, as depicted in FIG. 3. In this instance, both side faces of the conductive layers 7 and 9 and the non-single-crystal semiconductor layer 8, which define the widths thereof, are respectively in the same plane on both sides thereof. The conductive layer 7 or/and 8 are nontransparent. Each of the conductive layers 7 and 8 may be multi-layers, and one of the layer of the multilayers may be nontransparent.

The non-single-crystal semiconductor layer member 8 is, for example, a laminate member which is made up of one or more laminates of P- and N-type non-single-crystal semiconductor layers laminated in that order or in the opposite order to form a PN junction or junctions. In this example, the layer member 3 constitutes a nonlinear element whose voltage-current characteristic presents a diode characteristic in the positive or negative voltage region.

Another example of the non-single-crystal semiconductor layer member 8 is a laminate member which is formed of one or more laminates of P(or N)-, I- and N(or P)-type non-single-crystal semiconductor layers sequentially laminated in that order, forming an P(or N)-I-N(or P) junction. In this instance, the layer member 3 constitutes a nonlinear element whose voltage-current characteristic presents a diode characteristic in positive or negative voltage regions.

Yet another example of the non-single-crystal semiconductor layer member 8 is a laminate member in which N−, I(or P−)− and N-type non-single-crystal semiconductor layers or P−, I(N−)−and P-type non-single-crystal semiconductor layers are sequentially laminated in that order to form an NI(or P−)N or PI(or N−)P junction. Another example of the non-single-crystal semiconductor layer 8 is a laminate member in which N−, I(or P−)−P−I(or P−)−and N-type non-single-crystal semiconductor layers or P-, I(or N−)−N−I(or N−)−and P-type non-single-crystal semiconductor layers are sequentially laminated in that order to form an NI(or P−)PI(or P−)N or PI(or N−)NI(or N−)P junction. In these instances, the layer member 3 constitutes a nonlinear element whose voltage-current characteristic shows a diode characteristic in both positive and negative voltage regions.

Figure 4:
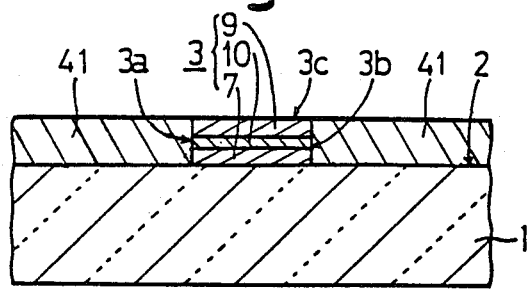
Figure 5:
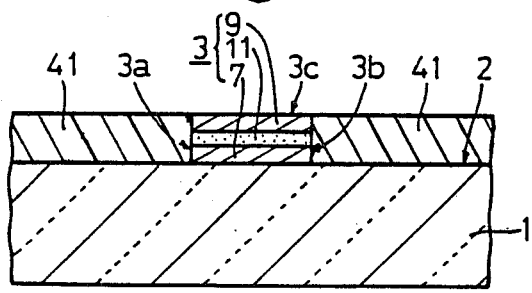

Another example of the laminate member 3 is identical in construction with that of FIG. 3 except that the non-single-crystal semiconductor layer member 8 is substituted with an I-type non-single-crystal semiconductor layer 10 as depicted in FIG. 4. Yet another example of the layer member 3 is identical in construction with that of FIG. 3 except that the semiconductor layer 8 is substituted with an insulating layer 11 as a barrier layer thin enough to permit the passage therethrough of a tunnel current as shown in FIG. 5. In these instances, the laminate member 3 forms a nonlinear element.

On the substrate 1 is formed an insulating layer 41 which surrounds the layer member 3. The insulating layer 41 is in contact with side faces 3a and 3b of the layer member 3 but does not extend onto the top surface 3c of the layer member 3. The insulating layer 41 is formed of, for instance, an organic resin such as a chemically stable heat-proof polyimide resin. The insulating layer 41 can be deposited to a desired thickness, for example, substantially the same thickness as that of the layer member 3, as shown.

On the insulating layer 41 is formed a conductive layer member or semiconductive (semiconductor) layer member which extends on the layer member 3 in contact therewith, as required. FIG. 2 shows the case where conductive layers 42a and 42b extending from both end portions of the layer member 3, as interconnection layers, are formed on the insulating layer 41. FIG. 3 shows the case where a conductive layer 43 extending across the layer member 3, as an electrode, is formed on the insulating layer 41. The conductive layer 43 is used, for example, as an electrode, for forming a liquid crystal element. The liquid crystal element is made up of the conductive layer 43, a conductive layer (not shown) serving as the other electrode formed in opposed relation thereto and a liquid crystal (not shown) filled in between the both conductive layers. In this case, the liquid crystal element is driven vial the layer member 3 and consequently via the nonlinear element.

The embodiment of the electronic device of the present invention, described above, produces such excellent effects as referred to in the Summary.

Next, the manufacturing method of the present invention will be described as being applied to the manufacture of the electronic device referred to above in connection with FIG. 3.

Figure 6A:
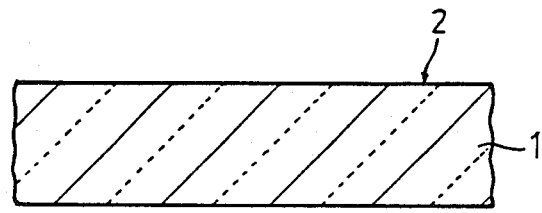
FIGS. 6A to 6G are cross-sectional views schematically illustrating a sequence of steps involved in the manufacture of the electronic device of the present invention in accordance with an embodiment of its manufacturing method.

The manufacture starts with the preparation of a light transparent substrate 1 similar to those mentioned above with respect to FIGS. 1 to 5, as depicted in FIG. 6A.

Figure 6B:
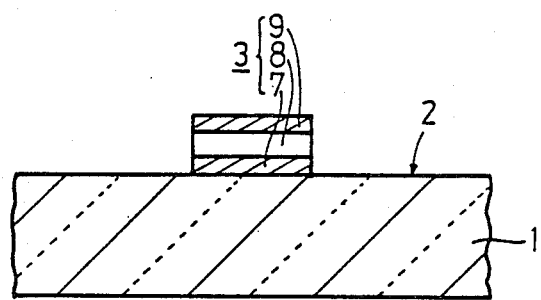

Next, a layer member 3 similar to that described above in respect of FIG. 3 is formed by a known process on the substrate 1, as shown in FIG. 6B.

Figure 6C:
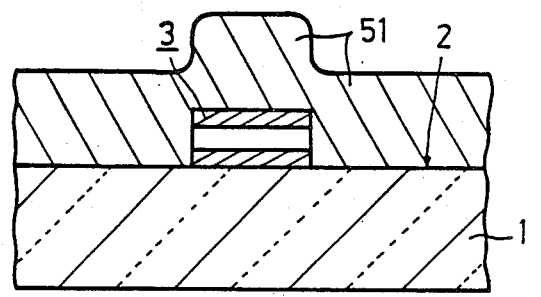

Next, a photosensitive organic resin layer 51 extending over the layer member 3 is formed by coating, for example, commercially available photosensitive polyimide resin on the substrate 1, as shown in FIG. 6C. The photosensitive polyimide resin is an precursor of polyimide resin and becomes polyimide resin upon exposure to light.

Figure 6D:
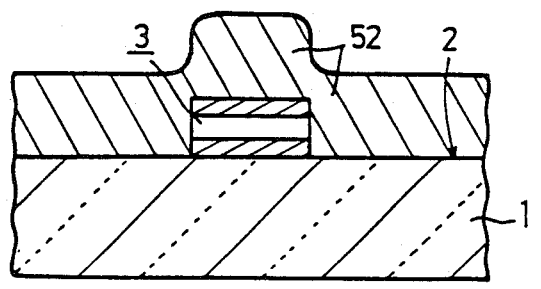

Next, the photosensitive organic resin layer 51 is heat-hardened, as required, for example, at 80° C. for 60 minutes, providing from the photosensitive organic resin 51, a heat-hardened photosensitive organic resin layer 52, as shown in FIG. 6D. The photosensitive resin layer 52 becomes thinner than the original photosensitive resin layer 51.

Figure 6E:
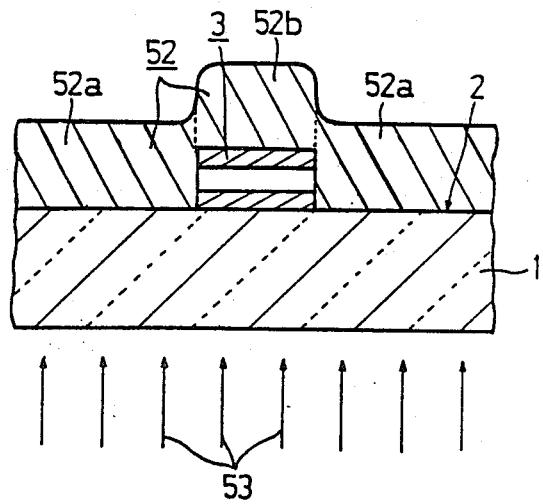

Next, the photosensitive resin layer 52 is exposed to light 53, for instance, ultraviolet rays of a 300 to 400 nm wavelength, which is directed from the side of the light transparent substrate 1, as indicated in FIG. 6E. In this instance, that portion 52a of the photosensitive resin layer 52 which does not lie on the layer member 3 is exposed to a larger amount of light than that for that portion 52b of the resin layer 52 which lies on the layer member 3.

Figure 6F:
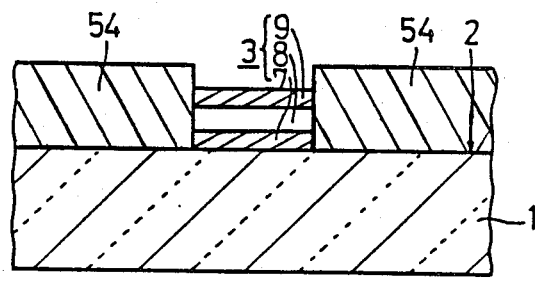

Next, the photosensitive resin layer 52 thus exposed to light is developed using a commercially available liquid developer removing the portion 52b of the photosensitive resin layer 52 lying on the layer member 3, as depicted in FIG. 6F. This development generally includes a step of dipping the exposed photosensitive resin layer 52, or spraying the liquid developer on the resin layer 52, and a step of rinsing the developed layer with isopropanol or like commercially available detergent. By subjecting the photosensitive resin layer 52 to such treatments as described above, the organic resin layer 54 is obtained which has substantially no photosensitivity.

Figure 6G:
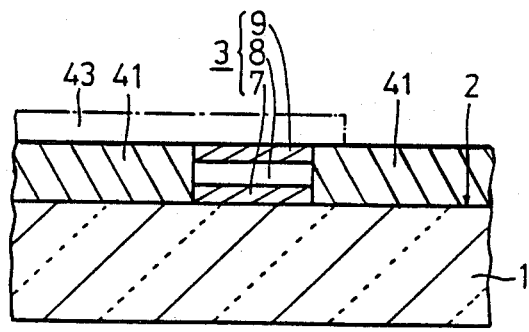

Next, the organic resin layer 54 is hardened by heating, for example, at 135° to 400° C. for 30 minutes, obtaining a heat-hardened organic resin layer 55 as the insulating layer 41 described previously in connection with FIGS. 1 to 5, as depicted in FIG. 6G. The insulating layer 41 is made thinner than the organic resin layer 54. The insulating layer 41 can be formed to the substantially the same thickness of the layer member 3 by selecting the thickness of the original photosensitive organic resin layer 51 to a suitable value larger than the thickness of the layer member 3.

Next, the conductive layer 43 serving as an electrode, described previously with respect to FIG. 3, is formed by a known technique, as liquid, as indicated by the chain line in FIG. 6G.

The manufacturing method of the present invention, described above, does not involve any particular mask for forming the insulating layer 41, and hence allow ease in the manufacture of the electronic device of the present invention.

The above embodiment should be construed as being merely illustrative of the present invention but not as limiting the invention specifically thereto.

It will be apparent that many modifications and variations may be effected without departing from the scope of the novel concepts of the present invention.

What is claimed is:

1. An electronic device manufacturing method comprising the steps of:
    providing a transparent substrate;
    forming at least one non-linear, multi-layered electronic element on a portion of said substrate, the transparence of said non-linear, multi-layered electronic element being substantially less than that of the substrate;
    coating said transparent substrate with a photocurable resin over at least the upper edge of said non-linear,layered electronic element;
    curing the part of said photocurable resin other than that on the upper surface of the non-linear multi-layered electronic element by exposure to illumination through said transparent substrate with said non-linear, mult-layered electronic element functioning as a mask; and
    removing uncured photocurable resin with a solvent so the cured part of the photocurable resin remains as an insulating film in close contact with all sides of the multi-layered electronic element, the contact between the insulating film and the sides of the non-linear, multi-layered electronic element being such that electrical shorts circuits between the layers of the non-linear multi-layered electronic element are prevented.

2. The manufacturing method according to claim 1 wherein the insulating film forming step further includes heat-hardening of the photocurable resin prior to the exposure of the resin and heat-hardening of the insulating film resulting from the removal of the uncured photocurable resin.

3. The manufacturing method according to claim 1 wherein the insulating film is formed thicker than the non-linear, multi-layered electronic element formed on the substrate.

4. The manufacturing method according to claim 1 wherein the insulating film is formed to a thickness on the substrate that is substantially the same as that of the non-linear, multi-layered electronic element formed on the substrate.

5. The manufacturing method according to claim 1 where said mult-layered electronic element has three layers where the first layer is an electrode adjacent the substrate, the second layer is a semiconductor, and the third layer is an electrode.

6. The manufacturing method according to claim 1 including forming a conductive electrode overlying said non-linear, multi-layer electronic element.

7. The manufacturing method according to claim 4 including forming a conductive electrode overlying said non-linear, multi-layer electronic element.

8. The manufacturing method according to claim 5 including forming a conductive electrode overlying said non-linear, multi-layer electronic element.

9. The manufacturing method as in claim 8 wherein the insulating film is formed to a thickness on the substrate that is substantially the same as that of the non-linear, multi-layered electronic element formed on the substrate.

* * * * *